United States Patent [19]
Peisker et al.

[11] Patent Number: 5,367,252
[45] Date of Patent: Nov. 22, 1994

[54] TEST FIXTURE FOR ELECTRONIC CIRCUIT BOARDS

[75] Inventors: Ulf Peisker, Jettingen; Wilhelm Braunwald, Gaeufelden, both of Germany

[73] Assignee: Hewlett-Packard Company, Palo Alto, Calif.

[21] Appl. No.: 971,939

[22] Filed: Nov. 5, 1992

[30] Foreign Application Priority Data

May 7, 1992 [DE] Germany .................. 9206126[U]

[51] Int. Cl.$^5$ ............................................ G01R 31/02
[52] U.S. Cl. ................................ 324/158.1; 324/754
[58] Field of Search ............. 324/158 F, 158 P, 72.5, 324/149, 537; 439/482, 49; 269/22, 21

[56] References Cited

U.S. PATENT DOCUMENTS

| | | | |
|---|---|---|---|
| 4,017,793 | 4/1977 | Haines | 324/158 F |
| 4,230,985 | 10/1980 | Matrone et al. | 324/158 F |
| 4,583,042 | 4/1986 | Riemer | 324/537 |
| 4,626,776 | 12/1986 | Wilkinson | 324/158 P |
| 4,780,086 | 10/1988 | Jenner et al. | 439/42 |

FOREIGN PATENT DOCUMENTS

| | | |
|---|---|---|
| 153010 | 8/1985 | European Pat. Off. . |
| 3340243 | 5/1985 | Germany . |
| 3508111 | 9/1986 | Germany . |

Primary Examiner—Vinh Nguyen

[57] ABSTRACT

A test fixture for electronic circuit boards includes a contact carrier plate and a pressure plate. The contact carrier plate is provided with contact pins projecting through holes of the pressure plate, in order to contact a circuit board to be tested. Upon the appliance of vacuum, the pressure plate, together with the circuit board under test, is sucked against the contact pins. The invention provides essentially flat contact between the circuit board under test and the pressure plate. For this purpose, no seal rests on top of the pressure plate, or at least a resilient seal which is completely compressed upon the appliance of vacuum. The invention demonstrates that, in contrast to the prior art, it is thus possible to achieve sufficient sealing.

19 Claims, 1 Drawing Sheet

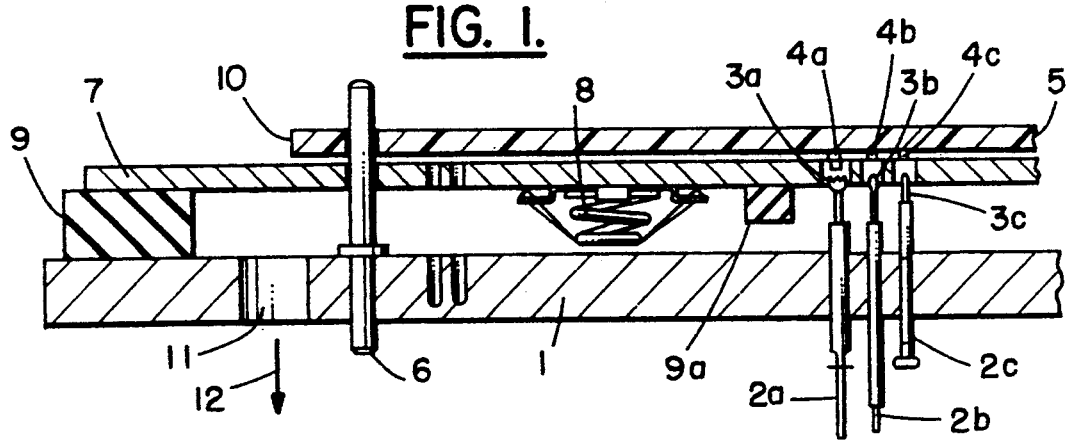
FIG. 1.
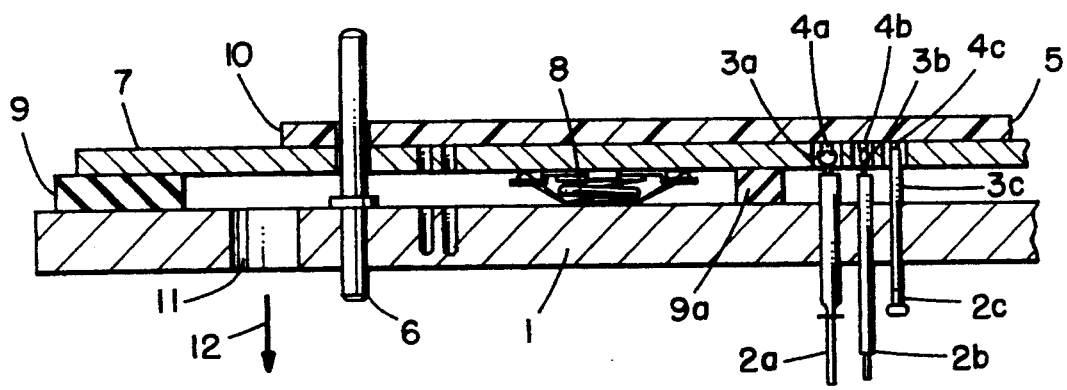
FIG. 2.
FIG. 3.
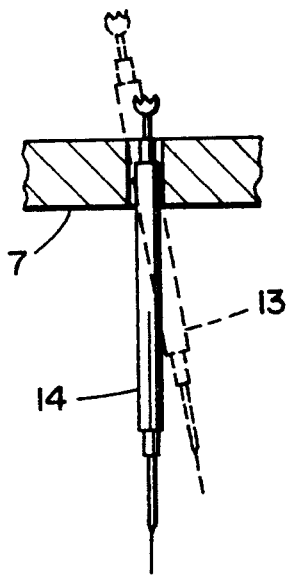
FIG. 4.
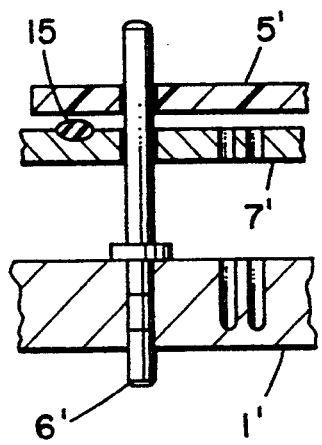
FIG. 5.
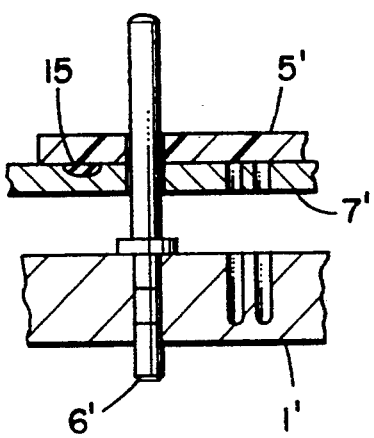

TEST FIXTURE FOR ELECTRONIC CIRCUIT BOARDS

FIELD OF THE INVENTION

The present invention relates to a test fixture for electronic circuit boards with contact pins held by a contact carrier plate; a pressure plate running essentially parallel to the contact carrier plate and movable towards it, said pressure plate being provided with holes for the contact pins; and a connection for a vacuum source to apply vacuum to the space between the contact carrier plate and the pressure plate.

BACKGROUND OF THE INVENTION

Test fixtures of the type described above are needed in order to test the operation of loaded electronic circuit boards. For example, tests can be made to determine whether a specified resistance value is present between two terminals, or whether an error in component loading has been made. The signal patterns of digital circuits and other electronic components can also be tested in this context. At the same time, the test ensures that the specified conductor paths are all present and conductive. One typical defect that occurs in the manufacture of electronic circuit boards consists of hairline cracks in conductor paths that cannot be detected by visual inspection, but that interrupt electrical signal flow. Such hairline cracks can be reliably detected with a test fixture of the kind mentioned above.

The test fixture is also suitable for testing unloaded circuit boards, insofar as only the electrical conductivity of the conductor paths is an issue.

One essential prerequisite for test fixtures of this kind is that the circuit boards under test must be replaceable quickly, so that a large number of circuit boards intended for delivery to customers can be tested with one and the same test fixture. Known test fixtures therefore include a so-called vacuum adapter to allow rapid contacting of the circuit board, and also allow quick detachment of the electrical connections. These known configurations provide for a contact carrier plate which holds electrical contact pins of a wide variety of types, for example with a press fit in corresponding holes. Arranged parallel to the contact carrier plate is a movable pressure plate that is provided with holes for the contact pins. The pressure plate (or support plate), for its part, carries the electronic circuit board under test. Upon the appliance of vacuum, the movable pressure plate, together with the circuit board under test, is pulled towards the contact carrier plate. As a result the contact pins pass through the holes in the pressure plate and contact the contact points provided on the circuit board under test, such that electrical contact is made and the testing process can begin.

It is understood that the contact carrier plate, rather than the pressure plate, can also be mounted in a movable fashion, or that both plates can be movable. What is important in this respect is only the relative movement of the two plates, so that the wording selected above also covers the case of a movable contact carrier plate. It is also understood that the contact carrier plate and the pressure plate must be adapted to the particular circuit board under test, since the contact points provided typically vary from one circuit board to another. It is therefore advisable, once a contact carrier plate and the corresponding pressure plate have been installed, to test a plurality of identical circuit boards with them. If a circuit board with a different function and/or geometry is to be tested, the contact carrier plate and the pressure plate must be replaced.

The crucial element that allows quick replacement of the circuit boards under test is therefore a vacuum source that pulls the contact carrier plate and the pressure plate towards one another, and thereby establishes electrical contact between the contact pins and the electronic circuit board under test.

One known problem of such vacuum adapters involves adequate sealing with respect to the atmosphere. If insufficient sealing is achieved here, the pressure plate will not be pulled to a sufficient extent towards the contact carrier plate, and the electrical contacts between the contact pins and the circuit board under test will not be established, or will be unreliable. The principal weak point in the necessary sealing is the circuit board under test. For example, if it cannot be achieved to prevent air from flowing over the edges of the circuit board through the holes in the pressure plate, then the desired level of vacuum between the contact carrier plate and pressure plate will be attained either incompletely or not at all.

Known test fixtures of the aforesaid type provide therefore a seal that seals the edges of the circuit board under test with respect to the atmosphere. Such a seal typically consists of a strip of silicone rubber or the like which is closed in itself and fastened on the pressure plate, wherein the edges (i.e., the outer regions of the bottom side) of the circuit board under test rest on said strip. A second strip of sealing material is placed on the first strip, and seals the flanges of the circuit board under test. One example of this kind of double seal is described in the manual entitled "HP 3070 Board Test System Users' Manual, Fixture for the HP 3070," (1990), page 8-3.

This manner of sealing the circuit board under test with respect to the atmosphere is extremely complex and costly. For example, the costs for producing a single silicone rubber seal are approximately 2000–3000 DM, since a mold hast to be produced, a casting has to be made etc. In view of the fact that the seal thus obtained can then be used only for a single pressure plate—in other words, only a single type of circuit board can be tested—it is evident that enormous costs can be incurred with a plurality of different circuit boards under test.

A further disadvantage of the known technology consists in the fact that the circuit board under test is arranged at a certain distance to the pressure plate, since the first sealing strip can only be made with a certain degree of resilience.

To prevent the circuit board from slipping off the step arranged between the first and the second sealing strip, and in order to prevent excessive deflection of the plate, test fixtures according to the prior art therefore have spacer blocks arranged on the upper surface of the pressure plate. The circuit board under test rests on these spacer blocks. However, the manufacture and application of the spacer blocks entails further costs. Moreover, a certain degree of deflection of the circuit board under test, namely between the individual spacer blocks, cannot be completely prevented. The circuit board is therefore subject to shear forces (or "board stress"), which in turn can cause defects such as the aforementioned hairline cracks.

SUMMARY OF THE INVENTION

It is an essential contribution of the inventors in the present case to have recognized that the measures taken in the prior art to seal between the pressure plate and the circuit board under test were based on a prejudice among those skilled in this art. Specifically, all those skilled in the art were of the opinion that maintaining a certain spacing between the pressure plate and the circuit board under test was indispensable in order to achieve sufficient sealing.

The inventors in the present case, however, determined on the basis of extensive experimentation that sufficient sealing can be obtained even if the circuit board under test essentially rests on the pressure plate. Application of vacuum pulls the circuit board under test against the pressure plate to a sufficient extent, which produces sealing with respect to the atmosphere that is sufficient for all practical purposes.

In the embodiment according to the invention of a test fixture for electronic circuit boards, the silicone rubber seals previously provided can therefore be omitted, as can the spacer pads previously used. This yields very considerable cost savings compared with the known embodiments, namely on the order of 2000–3000 DM for each set of contact carrier plate plus associated pressure plate. As mentioned, the spacer pads can also be omitted. Furthermore, since the circuit board under test rests essentially flat on the pressure plate, the shear forces that affect the circuit board in the case of fixtures according to the prior art are also eliminated, thus considerably reducing the risk of damage to the circuit board during testing. This prevents "board stress."

A test fixture in which the circuit board under test rests essentially flat on the pressure plate is of course also substantially easier to manufacture than the known test fixtures. One essential advantage of the new test fixture is further that, as there is no space between the pressure plate and the circuit board under test, the contact pins are less able, or entirely unable, to tilt. This results in more reliable test operation. The effect of the reduced tilting of the contact pins is also depicted in detail in the drawings and the description of the drawings.

According to a first embodiment of the invention, a test fixture of the aforesaid kind is therefore characterized in that the upper side of the pressure plate is essentially free of spacing means, such as spacer pads. According to another embodiment that includes the circuit board under test, the latter rests essentially flat on the pressure plate. According to a preferred embodiment, furthermore, no sealing means, such as sealing strips, for lateral contact with the end surfaces of the circuit board under test are present on the upper side of the pressure plate.

Sealing means that rest on the underside (i.e., not the end surfaces) of the circuit board under test can still be provided. However, in contrast to the prior art, these must then be sufficiently flexible such that when vacuum is applied, they are compressed basically to the level of the upper side of the pressure plate, so that the circuit board under test is resting on the pressure plate. Suitable sealing means in this context include, for example, strips of sealing material such as natural or vulcanized rubber.

It is also possible, however, to select a pressure plate surface that is free of any sealing means. Sufficient and favorable sealing is also achieved in this case. This sealing effect is essentially independent of the material and surface configuration of the pressure plate. For example, the surface of the pressure plate can be not only smooth, but also roughened or ribbed. However, the sealing effect is particularly notable with certain materials. Experiments have shown that PVC or neoprene are preferable. It is not necessary for the entire pressure plate to be made of this kind of plastic material (although this is of course possible); it is sufficient if at least its surface is suitably coated.

It is also advantageous if at least the surface of the pressure plate is made of a material with high electrical resistance. This counteracts the production of leakage currents and the like, so that circuit board testing can be performed reliably.

According to another preferred embodiment, the contact carrier plate is provided with a guide pin that is guided through a corresponding hole in the pressure plate and thereby prevents lateral displacement between the pressure plate and contact carrier plate.

After circuit board testing has been performed, the vacuum source is deactivated. Electrical contact between the circuit board under test and the contact pins can now be solved by various means, for example by applying pressure above atmospheric. According to an advantageous embodiment of the invention, however, spring means, especially a compression spring, are provided between the contact carrier plate and the pressure plate, to return the two plates to their original position. In this process as well, all that is important is the relative movement between pressure plate and contact carrier plate. The spring can therefore be fastened either to the pressure plate or to the contact carrier plate (preferably it is fastened to the pressure plate).

It is understood that in order to achieve the desired vacuum, sufficient sealing should also be provided between the contact carrier plate and the pressure plate itself. According to a further advantageous embodiment, sealing means such as peripheral sealing strips are therefore provided between the contact carrier plate and the pressure plate; spacing means (such as spacer blocks) can limit the relative movement of the two plates. This applies, however, only to the space between the bottom side of the pressure plate and the top side of the contact carrier plate; as already discussed in detail, no spacing means, and either no seals or resilient seals that essentially do not prevent contact between the circuit board under test and the pressure plate, are present on the upper side of the pressure plate.

BRIEF DESCRIPTION OF THE DRAWINGS

Further features and advantages of the present invention are evident from the dependent claims and from the following description of the drawings, which show the following:

FIG. 1: a cross section through a test fixture according to the invention, prior to the application of vacuum;

FIG. 2: a corresponding cross section after the vacuum source is activated;

FIG. 3: the reduced tilting of the contact pins in a test fixture according to the invention;

FIG. 4: a partial cross section through another embodiment of the invention prior to the application of vacuum; and FIG. 5: the same cross section as in FIG. 4, but after the application of vacuum.

DETAILED DESCRIPTION OF THE PREFERRED EMBODIMENTS

The cross section according to FIG. 1 shows a contact carrier plate 1 that is provided with holes into which contact pins 2a, 2b, and 2c fit with a press fit. These contact pins can be embodied in a wide variety of shapes. Their contact heads 3a-3c are spring-mounted by means of springs provided inside the pin housing, and are designed to make contact with corresponding electrical contact points 4a-4c of a circuit board 5 under test. For presentation purposes, only three contact pins and corresponding electrical contact points on the circuit board 5 are shown in FIG. 1; it is understood, however, that industrially manufactured circuit boards usually have a large number of such contact points, and that typically a plurality of contact pins are also set into the contact carrier plate 1.

Furthermore, a guide pin 6 is set into a corresponding hole in the contact carrier plate 1, and is held there in frictional connection, for example in a press fit. The guide pin 6 projects through corresponding holes in a pressure plate 7 and the circuit board 5, so that no significant horizontal movement may occur between these plates.

Applied on the bottom side of the pressure plate 7 are a compression spring 8 and a spacer pad 9a. A seal 9 in the form of a peripheral sealing strip provides sealing between the pressure plate 7 and the contact carrier plate 1.

It is particularly worth noting that—in contrast to the prior art—no spacing means are arranged between the circuit board 5 under test and the pressure plate 7. Also absent are seals contacting the underside of the circuit board 5, and seals that are in contact with the end surface 10 of the circuit board 10.

For presentation purposes, only a partial cross section through a test fixture according to the invention is shown in FIG. 1. It is self-evident that the test fixture as depicted in FIG. 1 continues to the right, and that a corresponding seal between the pressure plate 7 and the contact carrier plate i, as well as further spacer pads, springs, and contact pins as appropriate, are also provided there.

A hole 11 in the contact carrier plate 1 is used for application of a vacuum source, meaning that the air in the space between the pressure plate 7 and the contact carrier plate 1 is sucked out in the direction of the arrow 12. The vacuum source itself can be configured as in the prior art, and is therefore not depicted further in FIG. 1.

To test the circuit board 5, the latter is first placed on the pressure plate 7, as shown in FIG. 1, with correct angular positioning thereof being ensured by the guide pins (such as guide pin 6, although it is understood that further guide pins can also be utilized). Then the vacuum source is activated.

The test fixture is now in the position shown in FIG. 2. The pressure plate 7 is pulled against the contact carrier plate 1 until the spacer pad 9a contacts the contact carrier plate. This compresses the seal 5. The circuit board 5 lies essentially flat on the surface of the pressure plate 7. As also shown, the test heads 3a-3c of the contact pins 2a-2c are now in contact with the corresponding contacts 4a-4c of the circuit board 5, so that the necessary electrical tests can be performed.

The essentially flat manner in which the circuit board 5 rests on the pressure plate 7 guarantees sufficient sealing during this process in order to maintain the vacuum between the pressure plate 7 and the contact carrier plate 1. During the testing process, the compression spring 8 is further compressed, as shown in FIG. 2. When the vacuum source is then deactivated after the test has been performed, the compression spring 8 causes the pressure plate 7 and the circuit board 5 to return to the position shown in FIG. 1. The tested circuit board can then be removed.

FIG. 3 shows an enlarged partial cross section through the pressure plate 7. As mentioned above, known test fixtures were designed so that a certain minimum distance was maintained between the circuit board under test and the pressure plate. This allowed the contact pins to tilt, as depicted by the dashed outline of the contact pin 13 in FIG. 3.

In contrast to this, in a test fixture according to the invention the contact pin projects very little or not at all beyond the surface of the pressure plate 7, as shown for example by the contact pin 14 in FIG. 3. The risk of tilting of the contact pins is therefore also considerably reduced, meaning that the risk of improper contact is diminished.

The partial cross section according to FIG. 4 depicts a modified embodiment of the invention. This Figure shows a contact carrier plate 1' into which a guide pin 6' is set. The guide pin projects through corresponding holes of a pressure plate 7' and of a circuit board 5' under test. In contrast to the embodiment described in FIGS. 1 and 2, however, a seal 15 set into the surface of the pressure plate 7' is provided. The seal or sealing strip 15 consists of a relatively resilient material such as foam rubber or sponge rubber.

FIG. 4 shows the condition of the test fixture before vacuum is applied. After the vacuum source is activated, the position shown in FIG. 5 is attained. It is evident from this Figure that the seal 15 is sufficiently compressed so that the circuit board 5' rests essentially flat on the pressure plate 7'.

We claim:

1. A test fixture for electronic circuit boards, comprising:

a contact carrier plate having a plurality of upwardly extending contact pins;

a pressure plate running essentially parallel to and separated by a space from the contact carrier plate and movable towards the contact carrier plate, said pressure plate being provided with holes for receiving the upwardly extending contact pins, said pressure plate having an upper surface devoid of upwardly extending air barrier means, for receiving in face to face contact said electronic circuit boards; and a connection for a vacuum source to apply a vacuum to the space between the contact carrier plate and the pressure plate, whereby application of said vacuum to said connection causes said pressure plate and an electronic circuit board resident thereon to be drawn towards said contact carrier plate so as to enable said upwardly extending contact pins to make contact with an undersurface of a said circuit board, said holes in said pressure plate enabling said vacuum to hold engaged said circuit board on said pressure plate.

2. A test fixture according to claim 1, wherein at least the surface of the pressure plate is made of a plastic material.

3. A test fixture according to claim 1, wherein the upper surface of the pressure plate is smooth, roughened or ribbed.

4. A test fixture according to claim 1, wherein at least the surface of the pressure plate is made of a material with high electrical resistance.

5. A test fixture according to claim 1 including at least one guide pin held by the contact carrier plate, said guide pin being guided through a corresponding hole in the pressure plate.

6. A test fixture according to claim 1 including at least one compression spring arranged between the contact carrier plate and the pressure plate.

7. A test fixture according to claim 1 including sealing means arranged between the contact carrier plate and the pressure plate.

8. A test fixture according to claim 1 including spacing means arranged between the contact carrier plate and the pressure plate.

9. A test fixture according to claim 1 wherein said upper surface of said pressure plate is free of incompressible spacing means.

10. A test fixture for electronic circuit boards, comprising:
a contact carrier plate having a plurality of upwardly extending contact pins;
a pressure plate running essentially parallel to and separated by a space from the contact carrier plate and movable towards the contact carrier plate, said pressure plate being provided with holes for receiving the upwardly extending contact pins, said pressure plate for receiving in face to face engagement a said electronic circuit board and having an upper surface including a depression holding an upwardly extending air barrier sealing means, said sealing means compressible so as to not extend above said upper surface by a contacting electronic circuit board; and
a connection for a vacuum source to apply a vacuum to the space between the contact carrier plate and the pressure plate, whereby application of said vacuum to said connection causes said pressure plate and an electronic circuit board resident thereon to be drawn towards said contact carrier plate to enable said upwardly extending contact pins to make contact with an underside surface of said circuit board, said holes in said pressure plate enabling said vacuum to hold said circuit board flat on said pressure plate thereby fully compressing said sealing means into said depression.

11. A test fixture according to claim 10, wherein the sealing means are made of rubber.

12. A test fixture according to claim 10, wherein the sealing means are peripheral strips of sealing material.

13. A test fixture according to claim 10, wherein at least the upper surface of the pressure plate is made of a plastic material.

14. A test fixture according to claim 10, wherein the surface of the pressure plate is smooth, roughened or ribbed.

15. A test fixture according to claim 10, wherein at least the surface of the pressure plate is made of a material with high electrical resistance.

16. A test according to claim 10 including at least one guide pin held by the contact carrier plate, said guide pin being guided through a corresponding hole in the pressure plate.

17. A test fixture according to claim 10 including at least one compression spring arranged between the contact carrier plate and the pressure plate.

18. A test fixture according to claim 10 including sealing means arranged between the contact carrier plate and the pressure plate.

19. A test fixture according to claim 10 including spacing means arranged between the contact carrier plate and the pressure plate.

* * * * *